US010671183B2

(12) United States Patent
Sato et al.

(10) Patent No.: US 10,671,183 B2
(45) Date of Patent: Jun. 2, 2020

(54) KEYBOARD DEVICE

(71) Applicant: Topre Corporation, Tokyo (JP)

(72) Inventors: Takatoshi Sato, Sagamihara (JP); Yuichi Toyosawa, Sagamihara (JP)

(73) Assignee: TOPRE CORPORATION, Tokyo (JP)

( * ) Notice: Subject to any disclaimer, the term of this patent is extended or adjusted under 35 U.S.C. 154(b) by 0 days.

(21) Appl. No.: 16/343,314

(22) PCT Filed: Oct. 10, 2017

(86) PCT No.: PCT/JP2017/037289
§ 371 (c)(1),
(2) Date: Apr. 18, 2019

(87) PCT Pub. No.: WO2018/074389
PCT Pub. Date: Apr. 26, 2018

(65) Prior Publication Data
US 2019/0243466 A1 Aug. 8, 2019

(30) Foreign Application Priority Data

Oct. 10, 2017 (JP) .................................. 2016-205083

(51) Int. Cl.
*G06F 3/023* (2006.01)
*G06F 3/02* (2006.01)
*H03M 11/20* (2006.01)
*H01H 13/70* (2006.01)
*H01H 36/00* (2006.01)

(52) U.S. Cl.
CPC .............. *G06F 3/0238* (2013.01); *G06F 3/02* (2013.01); *G06F 3/0202* (2013.01); *G06F 3/023* (2013.01); *H01H 13/70* (2013.01); *H01H 36/00* (2013.01); *H03M 11/20* (2013.01)

(58) Field of Classification Search
CPC .......... G06F 3/02; G06F 3/0202; G06F 3/023; G06F 3/0238; H01H 13/70; H01H 36/00; H03M 11/20
See application file for complete search history.

(56) References Cited

U.S. PATENT DOCUMENTS

2003/0208324 A1* 11/2003 Bellwood ............. G06F 3/0202
702/41

* cited by examiner

*Primary Examiner* — Mihir K Rayan
(74) *Attorney, Agent, or Firm* — Kilpatrick Townsend & Stockton LLP

(57) ABSTRACT

A keyboard device applicable to various kinds of applications with high responsivity is provided. The keyboard device includes keys to which key addresses are assigned and a memory in which data for determining whether a key has been depressed is writable and readable at an memory address corresponding to each of the key addresses. The device also includes a key capacitance detecting unit to detect a capacitance of the key corresponding to a selected key address, a capacitance-voltage converting unit to convert the capacitance of the key detected by the key capacitance detecting unit into a voltage, a data converting unit that reads threshold data in the memory address in the memory corresponding to the key address that is selected to convert the threshold data into analog data, and a depression determining unit that compares the analog data with the voltage to determine whether the key has been depressed.

6 Claims, 5 Drawing Sheets

KEYBOARD DEVICE

CROSS-REFERENCE TO RELATED APPLICATIONS

The present application is a national phase application under 35 U.S.C. § 371 of International Application No. PCT/JP2017/037289, filed Oct. 10, 2017, which claims priority from Japanese Patent Application No. 2016-0205083 filed Oct. 19, 2016, the contents of which are hereby incorporated by reference into this application.

BACKGROUND

Technical Field

The present invention relates to a keyboard device in which an on-sensing position of each key of a group of keys is changeable.

Background Art

In a keyboard device of the related art, the keystroke of each key at the time of key input has been constant. In recent years, demands for the keyboard have become diverse. For example, gamers who use the keyboard only for games or the like need to perform quick operations while playing a game and thus prefer a shorter depressing keystroke or an upper (shallower) on-sensing position of the key (threshold for determining whether the key has been depressed) than usual.

PTL 1 describes a capacitive keyboard using a key switch by which the on-sensing position as to whether a key has been depressed is changeable.

CITATION LIST

Patent Literature

PTL 1: Japanese Unexamined Patent Application Publication No. 62-144220

SUMMARY

Technical Problem

However, gamers have had difficulty because they have been forced to use keyboards with different keystrokes according to game.

In addition, according to PTL 1, the key on-sensing position of all of the keys of the keyboard can only be changed collectively, and the on-sensing position cannot be changed for each of the keys.

Accordingly, an object of the present invention is to provide a keyboard device with which a user can change and adjust the on-sensing position for each of the keys so that a single keyboard is applicable to various kinds of applications with high responsivity.

Solution to Problem

In order to achieve the object, the keyboard device according to the present invention includes: a group of keys composed of a plurality of keys to which key addresses are assigned; a memory in which, for each of the plurality of keys, threshold data for determining whether the key has been depressed is writable and readable in a memory address corresponding to a corresponding one of the key addresses; a key capacitance detecting unit that detects a capacitance of the key corresponding to the key address that is selected; a capacitance-voltage converting unit that converts the capacitance of the key detected by the key capacitance detecting unit into a voltage; a data converting unit that reads threshold data in the memory address in the memory corresponding to the key address that is selected to convert the threshold data into analog data; and a depression determining unit that compares the analog data from the data converting unit with the voltage from the capacitance-voltage converting unit to determine whether the key has been depressed.

Advantageous Effects of Invention

With the keyboard device according to the present invention, for each of the plurality of keys, threshold data for determining whether the key has been depressed is set, the data converting unit converts the threshold data into analog data, and the depression determining unit compares the analog data from the data converting unit with the voltage from the capacitance-voltage converting unit to determine whether the key has been depressed. That is, by determining whether the key has been depressed and changing the threshold for determining whether the key has been depressed, the key on-sensing position can be changed.

Accordingly, it is possible to provide a keyboard device with which a user can change and adjust the on-sensing position for each of the keys so that a single keyboard is applicable to various kinds of applications with high responsivity.

DETAILED DESCRIPTION

Figure 1:
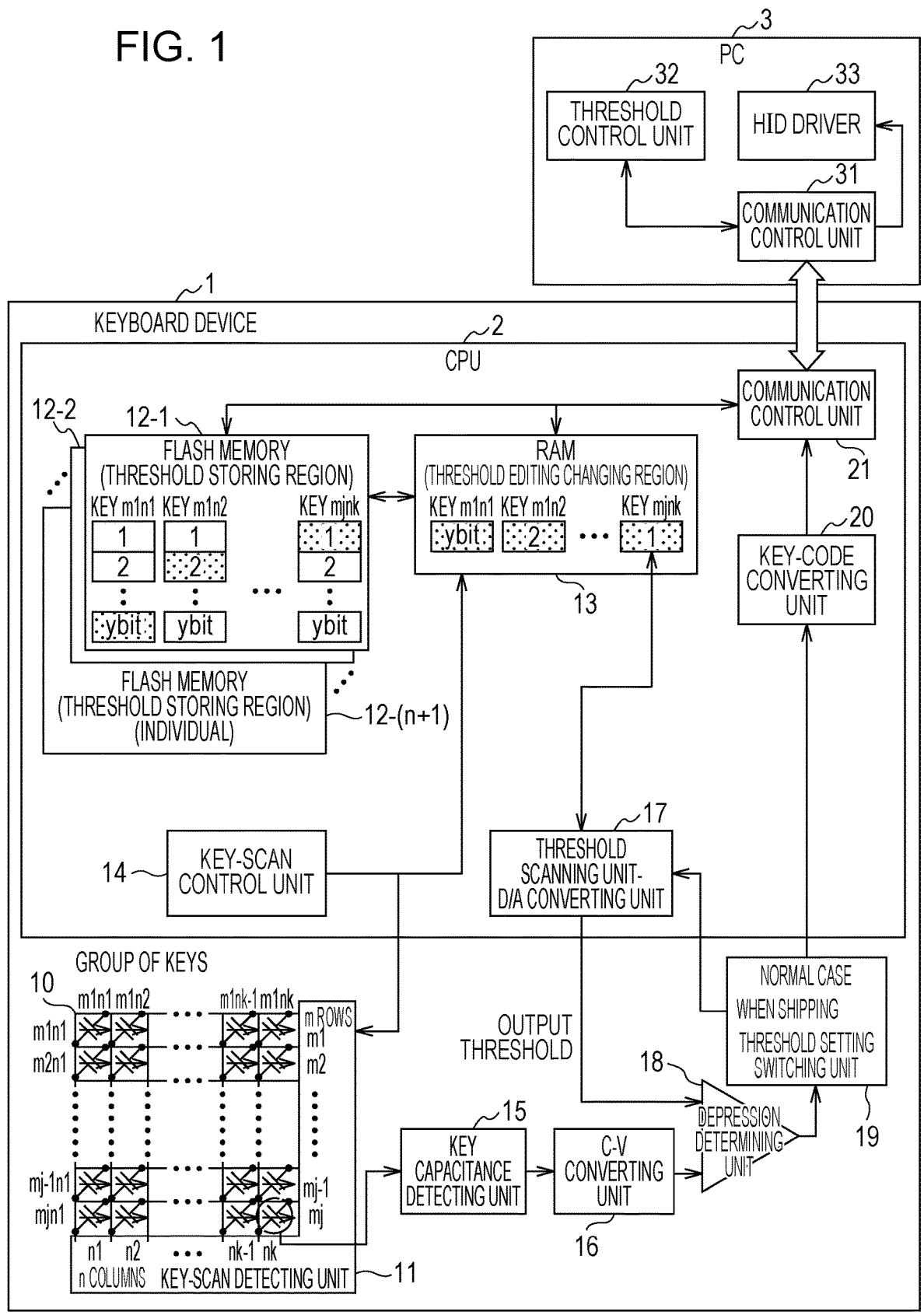
FIG. 1 is a block diagram illustrating a configuration of a keyboard device according to a first embodiment of the present invention.

Now, embodiments of a keyboard device according to the present invention will be described in detail with reference to the drawings. FIG. 1 is a block diagram illustrating a configuration of a keyboard device according to a first embodiment of the present invention. A keyboard device 1 determines whether a key has been depressed on the basis of a change in capacitance (analog value) and changes a threshold for determining whether the key has been depressed so as to change an on-sensing position of the key.

The keyboard device 1 includes a group of keys 10, a key-scan detecting unit 11, a flash memory 12, a random access memory (RAM) 13, a key-scan control unit 14, a key capacitance detecting unit 15, a C-V converting unit (capacitance-voltage converting unit) 16, a threshold scanning unit-D/A converting unit 17, a depression determining unit 18, a threshold setting switching unit 19, a key-code converting unit 20, and a communication control unit 21.

The flash memory 12, the RAM 13, the key-scan control unit 14, the threshold scanning unit-D/A converting unit 17, the key-code converting unit 20, and the communication control unit 21 are provided in a central processing unit (CPU) 2.

The group of keys 10 includes (m rows×n columns) keys as an electrical circuit, and a corresponding key address is assigned to each of the keys. The flash memory 12 is a non-volatile memory and stores, for each of the (m rows×n columns) keys of the group of keys 10, threshold data (threshold level) for the key on-sensing position in advance. When the power source is started, the threshold data of each key stored in the flash memory 12 is loaded into the RAM 13, and the threshold data of each key is stored in a memory address corresponding to the key address.

The key-scan control unit 14 selects the relevant key address from the group of keys 10 and detects the threshold data in the memory address corresponding to the selected key address from the RAM 13. The key-scan detecting unit 11 constantly scans the group of keys 10 and detects the key address selected by the key-scan control unit 14. The key capacitance detecting unit 15 detects the capacitance of the key in the key address detected by the key-scan detecting unit 11.

The C-V converting unit 16 converts the capacitance of the key detected by the key capacitance detecting unit 15 into voltage and outputs the voltage to the depression determining unit 18. The threshold scanning unit-D/A converting unit 17 reads a digital threshold of the key from the memory address in the RAM 13 selected by the key-scan control unit 14, converts the digital threshold into an analog threshold, and outputs the analog threshold to the depression determining unit 18.

The depression determining unit 18 determines that the key has been depressed (key-on) if the voltage from the C-V converting unit 16 is greater than or equal to the threshold from the threshold scanning unit-D/A converting unit 17, or determines that the key has not been depressed (key-off) if the voltage is less than the threshold, and outputs the data as to whether the key has been depressed to the threshold setting switching unit 19.

In a normal case, the threshold setting switching unit 19 outputs, to the key-code converting unit 20, the data from the depression determining unit 18 as to whether the key has been depressed. When the keyboard device is shipped and individual setting is made, the threshold setting switching unit 19 writes the threshold level at the time the key is on from the depression determining unit 18 to the RAM 13 through the threshold scanning unit-D/A converting unit 17.

The key-code converting unit 20 outputs a key code corresponding to the key from the threshold setting switching unit 19 to the communication control unit 21.

The keyboard device 1 is connected to a personal computer (PC) 3, and the PC 3 includes a communication control unit 31, a threshold control unit 32, and a human interface device (HID) driver 33. The communication control unit 31 communicates with the communication control unit 21 in the keyboard device 1. When a user selects a threshold, the threshold control unit 32 outputs the selected threshold to the communication control unit 21 in the keyboard device 1 through the communication control unit 31.

First Embodiment

Next, processes of the keyboard device according to the first embodiment having such a configuration will be described with reference to some drawings. First, processes performed when the power source is started, when the threshold is selected, and when the threshold is edited and changed will be described.

When the power source is started, the CPU 2 loads, into the RAM 13, the threshold data for the on-sensing position of each key of the group of keys 10 stored in the flash memory 12 immediately before the power source is started.

Also, when the user selects other threshold data, the CPU 2 loads, into the RAM 13, the threshold data for the on-sensing position of each key stored in the flash memory 12. As the threshold data, for example, a low threshold for realizing a shallow keystroke, a medium threshold for realizing a medium keystroke, and a high threshold for realizing a deep keystroke can be given as examples. The user selects any of these three thresholds.

If the user stores, in the RAM 13, threshold change data that is selected by the user as appropriate, the CPU 2 writes the threshold change data in the RAM 13 to a threshold storing region (individual) of the flash memory 12. Furthermore, if the user has edited the threshold data, the CPU 2 overwrites the threshold data only in the RAM 13 and does not overwrite data in the flash memory 12 unless a storing command is issued.

Figure 2:
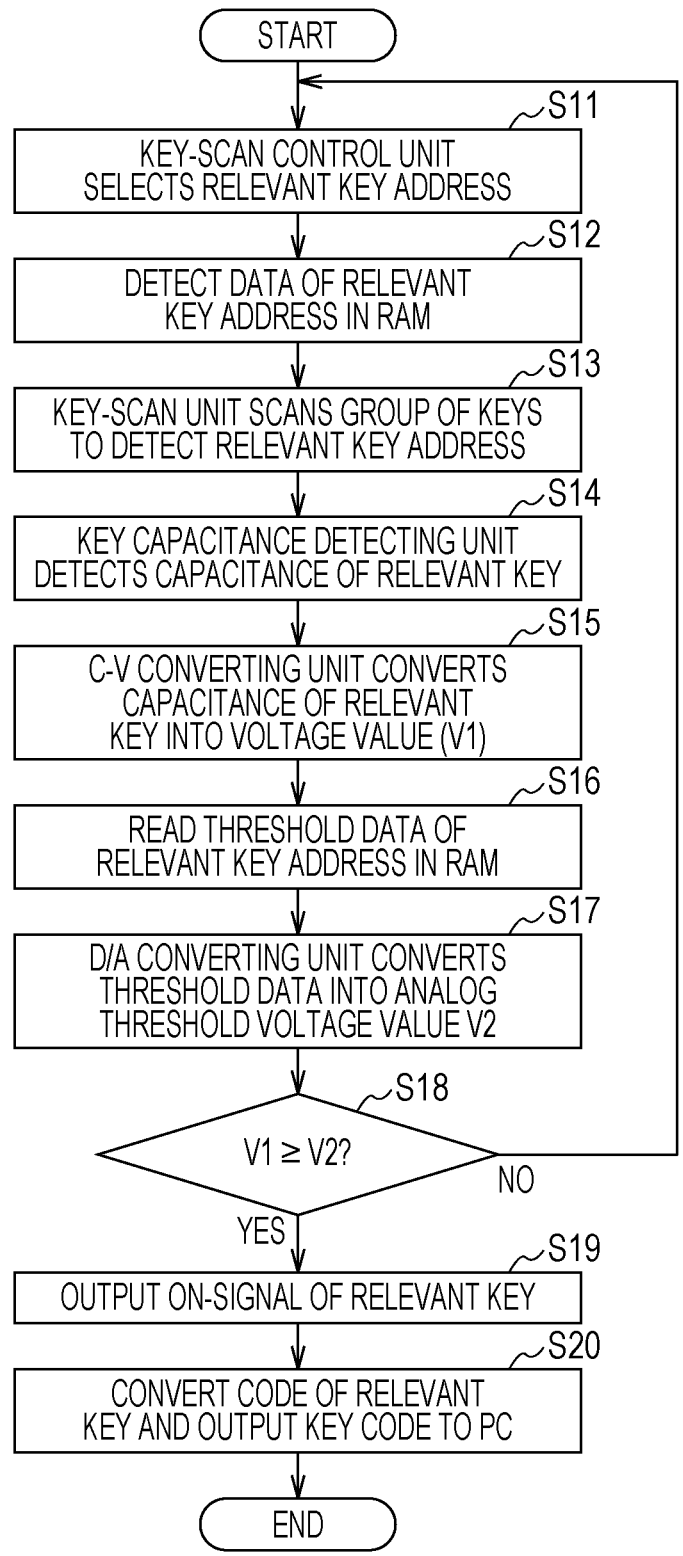
FIG. 2 is a flowchart illustrating a process in normal use of the keyboard device according to the first embodiment.

Next, an operation performed in normal use will be described with reference to the flowchart illustrated in FIG. 2. The following case will be described in which the threshold data in the threshold storing region of the flash memory 12 is loaded into a threshold editing changing region of the RAM 13 and the key code of a key address mjnk is output. In this example, the threshold level in the relevant key address mjnk of the flash memory 12 is m and is output to the RAM 13.

First, the key-scan control unit 14 selects the relevant key address from the group of keys 10 (step S11). Subsequently, the key-scan control unit 14 detects threshold data in the memory address of the RAM 13 corresponding to the selected key address (step S12).

Subsequently, the key-scan detecting unit 11 scans the group of keys 10 and detects the relevant key address selected by the key-scan control unit 14 (step S13). In addition, the key capacitance detecting unit 15 detects the capacitance of the key of the relevant key address (step S14). The C-V converting unit 16 converts the capacitance of the relevant key detected by the key capacitance detecting unit 15 into a voltage value V1 (step S15).

Furthermore, the threshold scanning unit-D/A converting unit 17 reads the digital threshold level of the key from the memory address in the RAM 13 selected by the key-scan control unit 14 (step S16), divides a digital threshold level m by a resolution of y bit, and multiplies the obtained value by the entire span voltage value V to calculate an analog threshold voltage value $V2=V \cdot (m/y \text{ bit})$ and outputs it to the depression determining unit 18 (step S17).

Furthermore, the depression determining unit 18 compares the voltage value V1 of the relevant key with the threshold voltage value V2 of the relevant key (step S18), and if $V1 \geq V2$ is satisfied, outputs an on-signal of the relevant key (step S19). If $V1 \geq V2$ is not satisfied, the process returns to step S11, and the process from step S11 to step S18 is repeated.

Subsequently, the threshold setting switching unit 19 receives an on-off output of a key from the depression determining unit 18, and in normal use, outputs the on-signal of the relevant key to the key-code converting unit 20 toward the PC 3 through the communication control unit 21. The key-code converting unit 20 converts the code of the relevant key and outputs the key code to the PC 3 through the communication control unit 21 (step S20).

In the above manner, with the keyboard device according to the first embodiment, for each of the plurality of keys, threshold data for determining whether the key has been depressed is set, the D/A converting unit 17 converts the threshold data into analog data, and the depression determining unit 18 compares the analog data from the D/A converting unit 17 with voltage from the C-V converting unit 16 to determine whether the key has been depressed. That is, by determining whether the key has been depressed and changing the threshold for determining whether the key has been depressed, the key on-sensing position can be changed.

Thus, it is possible to provide a keyboard device with which a user can change and adjust the on-sensing position for each of the keys so that a single keyboard realizes settings of shallow strokes and deep strokes for given keys and is applicable to various kinds of applications with high responsivity.

In addition, the threshold level of individual key is subdivided into the y-bit (resolution) level. Thus, compared with a manner of uniquely changing the threshold of all of the keys, the setting of the on-sensing position of preferred keys can be freely changed, thereby increasing a multiplicity of uses for sensitive key operations in applications such as games. In addition, the on-sensing position of all of the keys can be set steplessly for each of the keys.

In addition, since the threshold is stored in the flash memory 12, even if the power source is cut, the threshold is stored unless the threshold is newly updated. Furthermore, mechanical and electrical individual differences that the key structure potentially has can be absorbed, and a stable and highly accurate product can be provided. Furthermore, individual differences in capacitance that the capacitive keyboard can potentially have can be flexibly absorbed and handled.

(Process when User Selects Threshold)

Figure 3:
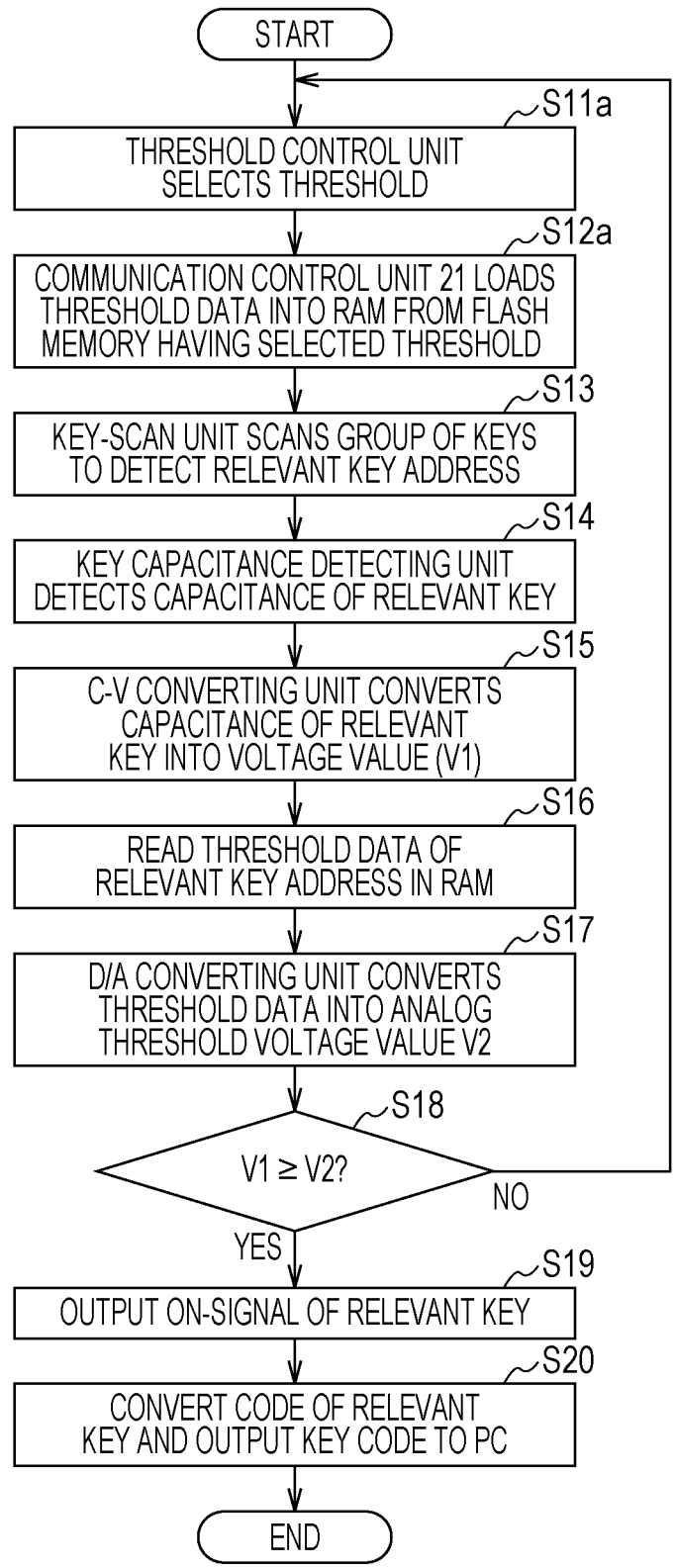
FIG. 3 is a flowchart illustrating a process of the keyboard device according to the first embodiment performed when a user selects a threshold.

Next, a process performed when a user selects a threshold will be described with reference to FIG. 3. In FIG. 3, the following case will be described in which the user selects the setting of the threshold storing region of the flash memory 12 from the PC 3, the set value is loaded into the threshold editing changing region of the RAM 13, and the key code of the key address mjnk is output. In this example, the threshold level of the relevant key address mjnk of the flash memory 12 is k and is output to the RAM 13.

First, the threshold selected by the user using the threshold control unit 32 of the PC 3 is transmitted to the communication control unit 21 through the communication control unit 31. As the threshold, for example, a low threshold for realizing a shallow keystroke, a medium threshold for realizing a medium keystroke, and a high threshold for realizing a deep keystroke can be given as examples. The user selects any of these three thresholds.

On the basis of the selected threshold, the communication control unit 21 selects the flash memory 12 having the selected threshold from among a plurality of flash memories 12-1 to 12-(n+1) (step S11a). Subsequently, the communication control unit 21 loads all data in the selected flash memory 12 into the RAM 13 (step S12a).

Subsequently, the key-scan detecting unit 11 scans the group of keys 10 and detects the relevant key address selected by the key-scan control unit 14 (step S13). In addition, the key capacitance detecting unit 15 detects the capacitance of the key of the relevant key address (step S14). The C-V converting unit 16 converts the capacitance of the relevant key detected by the key capacitance detecting unit 15 into a voltage value V1 (step S15).

Furthermore, the threshold scanning unit-D/A converting unit 17 reads the digital threshold level of the key from the memory address in the RAM 13 selected by the key-scan control unit 14 (step S16), divides a digital threshold level k by a resolution of y bit, and multiplies the obtained value by the entire span voltage value V to calculate an analog threshold voltage value $V2=V\cdot(k/y\ bit)$ and outputs it to the depression determining unit 18 (step S17).

Furthermore, the depression determining unit 18 compares the voltage value V1 of the relevant key with the threshold voltage value V2 of the relevant key (step S18), and if $V1 \geq V2$ is satisfied, outputs an on-signal of the relevant key (step S19). If V1 V2 is not satisfied, the process returns to step S11a, and the process from step S11a to step S18 is repeated.

Subsequently, the threshold setting switching unit 19 receives an on-off output of a key from the depression determining unit 18, and in normal use, outputs the on-signal of the relevant key to the key-code converting unit 20. The key-code converting unit 20 converts the code of the relevant key and outputs the key code to the PC 3 through the communication control unit 21 (step S20).

With the above configuration, the user can select and determine the key threshold individually for all of the keys. In addition, it is possible to store a plurality of key thresholds individually for all of the keys.

Second Embodiment

Figure 4:
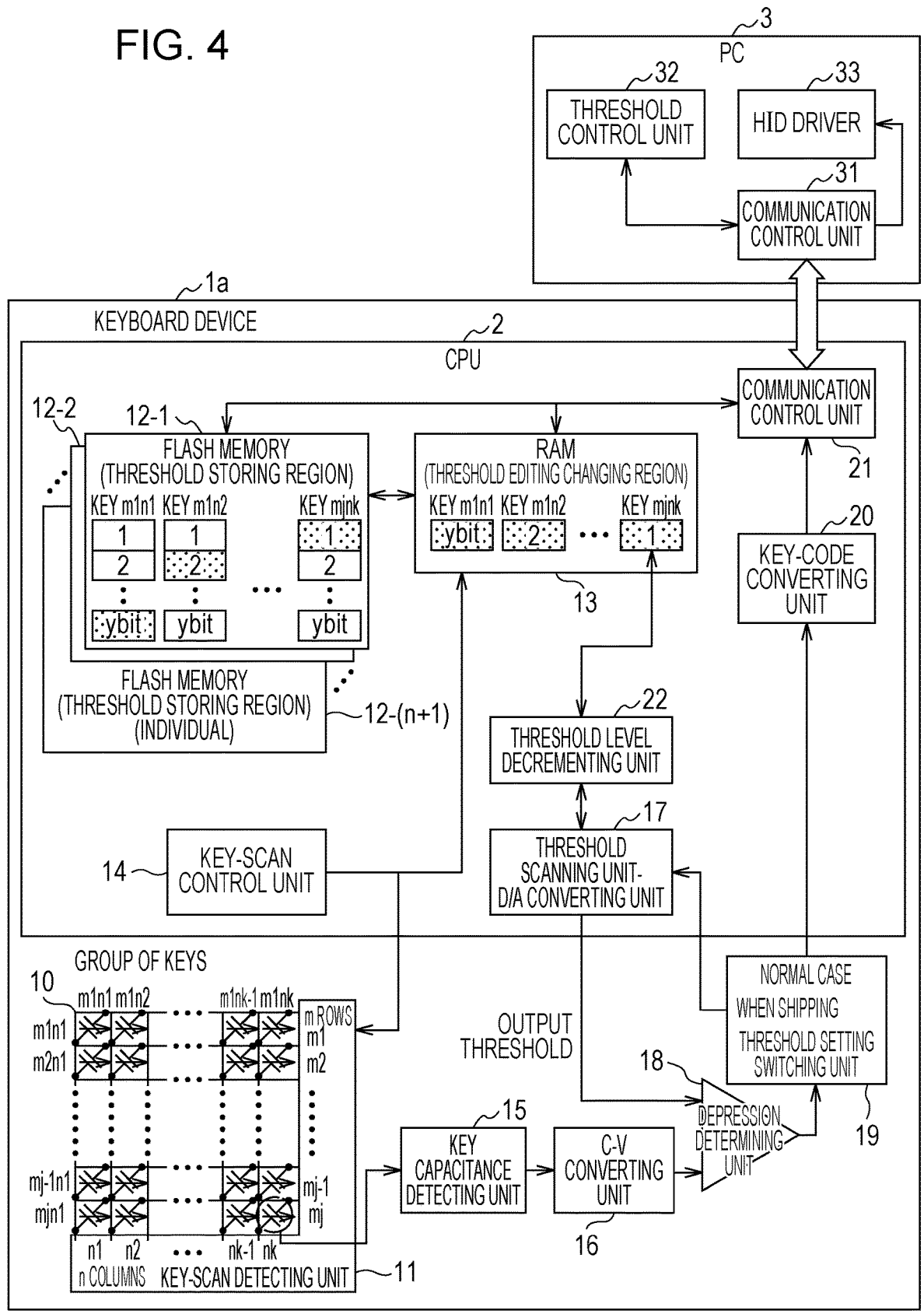
FIG. 4 is a block diagram illustrating a configuration of a keyboard device according to a second embodiment of the present invention.

FIG. 4 is a block diagram illustrating a configuration of a keyboard device according to a second embodiment of the present invention. Since the respective keys have individual differences in terms of structure, when spacers having the same thickness are inserted to all of the keys and all of the keys are depressed, the on-sensing position differs for each of the keys. For example, a certain key corresponds to level 3, and another key corresponds to level 2. Thus, in the keyboard device according to the second embodiment, spacers having the same thickness are inserted to all of the keys, and the threshold corresponding to the on-sensing position for each key when all of the keys are depressed is calculated so as to absorb the individual differences of the keys.

In this example, for each of spacers having three different thicknesses, the corresponding threshold is calculated. For example, the following spacers are sequentially inserted to the keys to calculate the thresholds: a thick spacer for realizing a keystroke of 1.5 mm, a medium-thickness spacer for realizing a keystroke of 2.2 mm, and a thin spacer for realizing a keystroke of 3.0 mm.

As illustrated in FIG. 4, the keyboard device according to the second embodiment includes a threshold level decrementing unit 22 in the keyboard device according to the first embodiment. When the spacers are inserted to all of the keys and all of the keys are depressed, the threshold level decrementing unit 22 decrements the threshold level sequentially from a high threshold level to a low threshold, and outputs the decremented threshold level to the threshold scanning unit-D/A converting unit 17.

Figure 5:
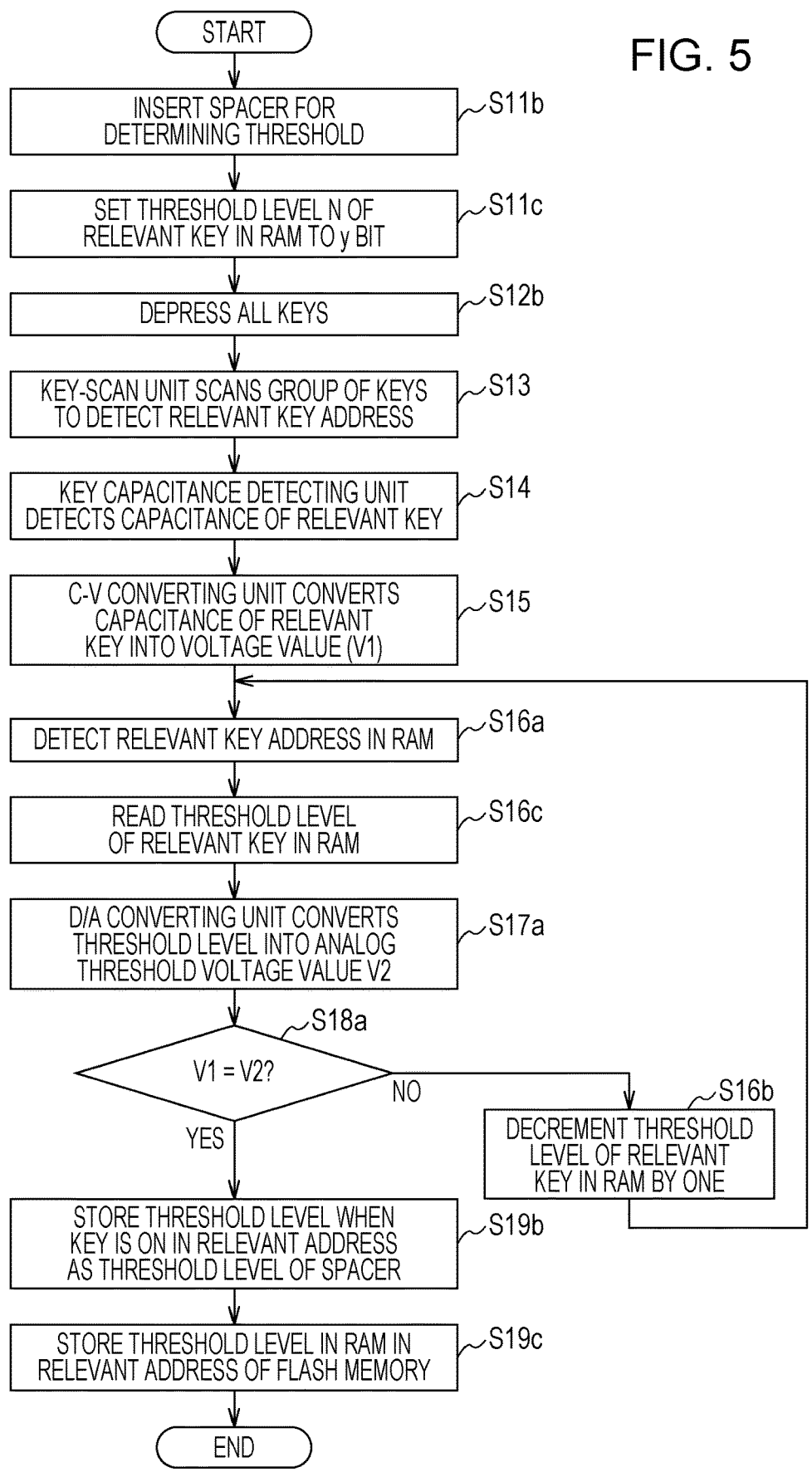
FIG. 5 is a flowchart illustrating a process performed when the keyboard device according to the second embodiment is shipped and individual setting is made.

Next, a process performed when the keyboard device according to the second embodiment is shipped and individual setting is made will be described with reference to the flowchart illustrated in FIG. 5. In this example, a process in which a threshold level N of the relevant key address is x and in which V2=V1 is satisfied will be described.

First, spacers for determining the threshold level is inserted to a keyboard (step 11b). Subsequently, the threshold level N of the relevant key in the RAM 13 is set to N=y bit (step 11c).

Subsequently, all of the keys are depressed so that all of the keys are pressed to the spacers for determining the threshold level (step 12b). Subsequently, the key-scan detecting unit 11 scans the group of keys 10 and detects the relevant key address selected by the key-scan control unit 14 (step S13). In addition, the key capacitance detecting unit 15 detects the capacitance of the key of the relevant key address (step S14). The C-V converting unit 16 converts the capacitance of the relevant key detected by the key capacitance detecting unit 15 into a voltage value V1 (step S15).

Furthermore, the relevant key address in the RAM 13 is detected (step S16a), and the threshold scanning unit-D/A converting unit 17 reads the threshold level of the relevant key address in the RAM 13 (step S16c), D/A converts the threshold level N, calculates an analog threshold voltage value $V2=V \cdot (1/y\ bit)$ and outputs the analog threshold voltage value V2 to the depression determining unit 18 (step S17a).

Furthermore, the depression determining unit 18 compares the voltage value V1 of the relevant key with the threshold voltage value V2 of the relevant key (step S18a), and if V1=V2 is not satisfied, the threshold level decrementing unit 22 decrements the D/A value (threshold level) in the RAM 13 by one (step S16b). Note that the initial value of the threshold is N, and a decrement operation of N=N−1 is performed. Subsequently, the process returns to step S16a, and the process in step S16a, step S16c, step S17a, step S18a, and step S16b is repeated.

That is, the threshold level decrementing unit 22 decrements the threshold level N of the key in the RAM 13 one by one, such as N, N−1, N−2, ..., x, ... 3, 2, 1, scans the threshold level stepwise, and repeats the operation $V2=V \cdot (x/y\ bit)$ until the threshold voltage V2 becomes equal to the voltage value V1.

If V1=V2 is satisfied according to the depression determining unit 18, the threshold setting switching unit 19 sets a threshold level x at the threshold voltage V2 when becoming equal to the voltage V1 as the threshold level of the spacer, and causes the threshold level x to be stored in the relevant key address of the RAM 13 (step S19b). Furthermore, the CPU 2 causes the threshold level x of the RAM 13 to be stored in the threshold storing region of the flash memory 12 or the relevant address in the threshold storing region (individual) (step S19c).

In the above manner, with the keyboard device according to the second embodiment, spacers having the same thickness are inserted to all of the keys, and the threshold corresponding to the on-sensing position for each key when all of the keys are depressed is calculated. That is, it is possible to set, for each key, such a threshold as to absorb the individual differences of the keys. Thus, even if the respective keys have individual differences in terms of structure, the individual differences of the keys can be absorbed. In addition, by using a single spacer individually for all of the keys, the key threshold can be uniquely changed.

Although the first and second embodiments have described the capacitive keyboard device in which the key on-sensing position of a given key is changeable to a given position, the present invention is not necessarily a capacitive keyboard device. For example, it is possible to use any keyboard device that is an analog-type input device and that can set a threshold so as to output a result as to whether the key has been depressed (on/off).

REFERENCE SIGNS LIST 1 keyboard device
2 CPU
3 personal computer (PC)
10 group of keys
11 key-scan detecting unit
12 flash memory
13 random access memory (RAM)
14 key-scan control unit
15 key capacitance detecting unit
16 C-V converting unit
17 threshold scanning unit-/A converting unit
18 depression determining unit
19 threshold setting switching unit
20 key-code converting unit
21, 31 communication control unit
22 threshold level subtracting unit
32 threshold control unit

The invention claimed is:

1. A keyboard device comprising:
    a plurality of keys to which key addresses are assigned;
    a memory in which, for each of the plurality of keys, threshold data for determining whether the key has been depressed is writable and readable in a memory address corresponding to a key address;
    a key capacitance detecting unit that detects a capacitance of the key corresponding to the key address that is selected;
    a capacitance-voltage converting unit that converts the capacitance of the key detected by the key capacitance detecting unit into a voltage;
    a data converting unit that reads the threshold data in the memory address corresponding to the key address that is selected to convert the threshold data into analog data; and
    a depression determining unit that compares the analog data from the data converting unit with the voltage from the capacitance-voltage converting unit to determine whether the key has been depressed.

2. The keyboard device of claim 1, further comprising a flash memory in which the threshold data of all of the plurality of keys is stored and from which the threshold data of all of the keys is written into the memory when the keyboard device is started.

3. The keyboard device of claim 2, further comprising:
    a communication control unit that communicates with an external computer that selects the threshold data,
    wherein the flash memory includes a plurality of flash memories, and
    wherein the communication control unit selects the flash memory including the threshold data selected by the external computer to load, into the memory, the threshold data from the flash memory that is selected.

4. The keyboard device of claim 2, wherein, when an operation is stored, the threshold data stored in the memory is read and stored in the flash memory.

5. The keyboard device according to claim 1, further comprising a threshold setting unit that, when the analog data from the data converting unit becomes equal to the voltage from the capacitance-voltage converting unit, performs processing to store the threshold data at that time in the memory for each key.

6. The keyboard device of claim 3, wherein, when an operation is stored, the threshold data stored in the memory is read and stored in a flash memory of the plurality of flash memories.

\* \* \* \* \*